United States Patent
Meinerzhagen et al.

(10) Patent No.: US 9,520,877 B2
(45) Date of Patent: Dec. 13, 2016

(54) APPARATUS AND METHOD FOR DETECTING OR REPAIRING MINIMUM DELAY ERRORS

(71) Applicant: Intel Corporation, Santa Clara, CA (US)

(72) Inventors: Pascal A. Meinerzhagen, Hillsboro, OR (US); Sandip Kundu, Amherst, MA (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/572,031

(22) Filed: Dec. 16, 2014

(65) Prior Publication Data

US 2016/0173090 A1    Jun. 16, 2016

(51) Int. Cl.
*H03L 7/00* (2006.01)
*H03K 19/003* (2006.01)
*H03K 5/26* (2006.01)

(52) U.S. Cl.
CPC .......... *H03K 19/00323* (2013.01); *H03K 5/26* (2013.01)

(58) Field of Classification Search
CPC .................. H01L 2924/0002; H01L 2924/00; G06F 17/505; G06F 17/5031
See application file for complete search history.

(56) References Cited

U.S. PATENT DOCUMENTS 6,242,954 B1* 6/2001 Taniguchi ................. G06F 1/10
                                                     327/149
2002/0186087 A1* 12/2002 Kim .......................... H03L 7/07
                                                     331/100

OTHER PUBLICATIONS

Nagaraj, K., and Kundu, S.,"An automatic post silicon clock tuning system for improving system performance based on tester measurements," in IEEE International Test Conference (ITC), 2008.
Mahoney, P., Fetzer, E., Doyle, B.,and Naffziger, S., "Clock distribution on a dual-core, multi-threaded Itanium®-family microprocessor," in IEEE International Solid-State Circuits Conference (ISSCC), 2005.

* cited by examiner

*Primary Examiner* — Sibin Chen
(74) *Attorney, Agent, or Firm* — Schwabe, Williamson & Wyatt, P.C.

(57) ABSTRACT

Described are apparatuses and methods for detecting or repairing minimum-delay errors. The apparatus may include a minimum-delay error detector (MDED) to receive a clock signal and a data path signal and to detect a minimum-delay error (MDE) in the data path based on the received data path signal and the clock signal. The MDE may be repaired by adjusting one or more regional clock buffers coupled to the MDED. Further, the apparatus may include minimum-delay path replicas (MDPRs) used for detecting and repairing MDEs during normal system operations. Other embodiments may be described and/or claimed.

16 Claims, 12 Drawing Sheets

APPARATUS AND METHOD FOR DETECTING OR REPAIRING MINIMUM DELAY ERRORS

STATEMENT OF GOVERNMENT INTEREST

This invention was made with Government support under contract number FA8650-13-37338 awarded by the Department of Defense. The Government has certain rights in this invention.

TECHNICAL FIELD

This disclosure relates generally to electronic circuits. More particularly but not exclusively, the present disclosure relates to apparatuses and methods for detecting or repairing minimum-delay errors.

BACKGROUND

Conventional clocking disciplines of synchronous digital very-large-scale-integration (VLSI) circuits, such as single-phase positive-edge triggered clocking, entail both timing paths with a minimum and maximum delay requirement. Maximum-delay paths need to be faster than a given threshold to meet a target operating frequency while guaranteeing proper data setup timing at capturing flip-flops in pipelines, while minimum-delay paths need to be longer than a lower limit to avoid pipeline data corruption due to race through or hold time violations at the capturing flip-flop.

In particular, at the end of minimum-delay paths, pipeline data corruption may occur due to fast (e.g., faster than nominal) data path delay, long (e.g., longer than nominal) clock skew, or a degraded hold time of the capturing flip-flop. Such minimum-delay violations may be caused by integrated circuit (IC) power-supply (Vcc) noise, clock jitter, Process-Voltage-Temperature (PVT) variations, and other noise sources, and are normally aggravated by aging. In particular, clock skew typically degrades due to aging. In fact, the transistor threshold voltage (Vt) and thus the clock buffer delays may increase due to aging, especially under direct current (DC) stress found in gated clock domains, while constantly activated clock domains suffer from aging to a lesser extent.

Unfortunately, on manufactured state-of-the-art microchips, it is virtually impossible to detect and locate pipeline data corruption due to a minimum-delay problem (e.g., fast data path, increased clock skew, increased flip-flop hold time). Additionally, unlike maximum-delay problems on critical timing paths, which may be resolved by reducing the clock frequency or increasing the voltage, minimum-delay errors are not sensitive to frequency and may be impossible to eliminate with voltage adjustment. Therefore, a single minimum-delay failure could result in a completely non-functional microprocessor or system-on-chip (SoC).

The background description provided herein is for generally presenting the context of the disclosure. Unless otherwise indicated herein, the materials described in this section are not prior art to the claims in this application and are not admitted to be prior art or suggestions of the prior art, by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
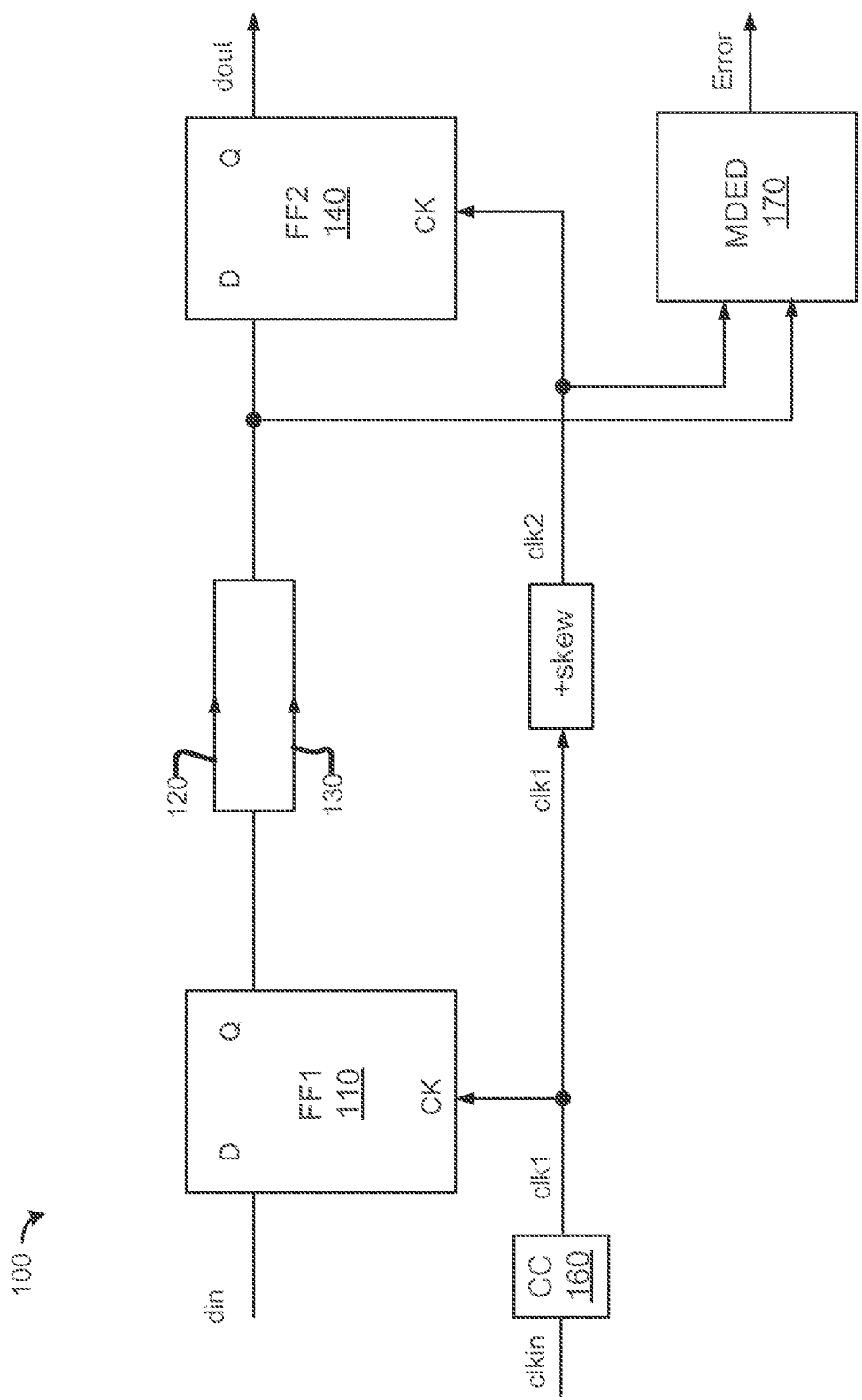
FIG. 1 is a block diagram that illustrates an example apparatus with a minimum-delay error detector, incorporating aspects of the present disclosure, in accordance with various embodiments.

The embodiments described herein include apparatuses and methods for detecting or repairing minimum-delay errors. In various embodiments, a specifically designed circuit for detecting minimum-delay errors may be inserted at the capturing flip-flop of a pipeline segment. In a minimum-delay debug mode, maximum-delay paths may be restricted to toggle only during a specific clock phase (i.e., either high or low), while data transitions during the other clock phase (i.e., either low or high) may be detected and identified as minimum-delay errors.

In some embodiments, an apparatus may include a clock circuit to receive a first clock signal with a first frequency in a normal operation mode, and further output a second clock signal with a second frequency in a minimum-delay debug mode, wherein the second frequency in the minimum-delay debug mode is lower than the first frequency in the normal operation mode. The apparatus may further include a minimum-delay error detector (MDED), coupled to the clock circuit, to receive the second clock signal and a data signal from a data path, to detect a minimum-delay error (MDE) in the data path based on the received data signal and the second clock signal in the minimum-delay debug mode.

In some embodiments, a system may include a first regional clock buffer (RCB) and a second RCB coupled to the first RCB. The system may further include a first circuitry, coupled to the first RCB, to receive a first clock signal from the first RCB. The system may further include a second circuitry, coupled to the first circuitry and the second RCB, to receive a data signal from the first circuitry via one or more inter-regional paths, and to receive a second clock signal from the second RCB. The system may further include a third circuitry, coupled to the first circuitry and the second circuitry, including a minimum-delay error detector (MDED) and a minimum delay path replica (MDPR) having a delay equal to or shorter than a shortest data path of the one or more inter-regional paths. The MDED may detect a minimum-delay error (MDE) of the MDPR caused by a delay between the second clock signal and the first clock signal. In some embodiments, MDEs may be caused by the second clock signal being delayed with respect to the first clock signal. These embodiments will be described in more detail below. Other technical effects will also be evident from the descriptions to follow.

In the following description, numerous details are discussed to provide a more thorough explanation of embodiments of the present disclosure. However, it will be apparent to one skilled in the art that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate the information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the objects that are connected, without any intermediary devices. The term "coupled" means either a direct electrical connection between the objects that are connected or an indirect connection through one or more passive or active intermediary devices. The term "circuit" means one or more passive and/or active components that are arranged to cooperate with one another to provide a desired function. The term "signal" means at least one current signal, voltage signal, or data/clock signal. The meaning of "a," "an," and "the" include plural references. The meaning of "in" includes "in" and "on."

The terms "substantially," "close," "approximately," "near," and "about" generally refer to being within +/−20% of a target value. The term "scaling" generally refers to converting a design (schematic and layout) from one process technology to another process technology. The term "scaling" generally also refers to downsizing layout and devices within the same technology node. The term "scaling" may also refer to adjusting (e.g., slowing down) a signal frequency relative to another parameter, for example, power supply level.

Unless otherwise specified, the use of the ordinal adjectives "first," "second," "third," etc., to describe a common object merely indicates that different instances of like objects are being referred to, and are not intended to imply that the objects so described must be in a given sequence, either temporally, spatially, in ranking, or in any other manner.

FIG. 1 is a block diagram that illustrates an example apparatus 100 with a minimum-delay error detector (MDED) 170. In various embodiments, apparatus 100 may be a part of a VLSI circuit, and the apparatus 100 shown in FIG. 1 may embody a pipeline segment of the VLSI circuit.

In various embodiments, apparatus 100 may include a clocked storage circuit, such as flip-flop 1 (FF1) 110, to receive data (e.g., din) from the pipeline, as well as a clock signal (e.g., clk1). FF1 110 may be coupled to another clocked storage circuit, such as flip-flop 2 (FF2) 140, via a data path. Data may be transmitted from FF1 110 to FF2 140 via a selected data path, e.g., a short timing path 120 or a long timing path 130. Short timing path 120 may have a minimum-delay requirement, and long timing path 130 may have a maximum-delay requirement. As an example, long timing path 130 may have a maximum-delay requirement to meet the operating frequency target without violating the setup time of the capturing FF2 140. As another example, short timing path 120 may have a minimum-delay requirement to avoid data corruption at FF2 140.

In various embodiments, FF2 140 may capture data launched from FF1 110 via the selected data path, which may add some delay to the data. In some embodiments, data output from FF1 110 may travel via the long timing path to FF2 140, which may receive the data with a long delay. In some embodiments, data output from FF1 110 may travel via the short timing path to FF2 140, which may receive the data with a short delay instead.

In various embodiments, apparatus 100 may include clock circuit (CC) 160 to receive a clock signal clkin and output another clock signal clk1. The clock signal clk1 may travel in the same direction as the data signal as shown. The clock signal clk1 may be received by FF1 110. However, clk2, a skewed version of clk1 (e.g., caused by a clock skew), may be received by FF2 140 and MDED 170. Thus, FF1 110 and FF2 140 may receive the clock signal (e.g., sent from a regional clock buffer (not shown)) at different times. Clock skew may be caused by, for example, unbalanced clock trees, wire-interconnect length variations, temperature variations, variation in intermediate devices, capacitive coupling, material imperfections, or differences in input capacitance on the clock inputs of devices using the clock. In various embodiments, the clock skew may cause minimum-delay violations.

CC 160 may be located at the input of the clock distribution network in some embodiments. In various embodiments, CC 160 may receive clkin and output another clock signal clk1. In a normal operation mode, CC 160 may work as a pass-through entity, so that clk1 may be substantially the same as clkin, e.g., with a same first frequency. In a minimum-delay debug mode, however, CC 160 may receive clkin with the first frequency and adjust the received clock signal to output clk1 with a second frequency. In some embodiments, the second frequency in the minimum-delay debug mode is lower than the first frequency in the normal operation mode.

In various embodiments, apparatus 100 may include minimum-delay error detector (MDED) 170. MDED 170 may be coupled with the selected data path between FF1 110 and FF2 140. In some embodiments, MDED 170 may be inserted at the capturing flip-flop (e.g., FF2 140) to detect minimum-delay errors (MDEs).

In various embodiments, MDED 170 may receive clk2. In some embodiments, the frequency of clk1 and clk2 in the minimum-delay debug mode may be lower than or equal to a half of the frequency of clkin. As an example, the frequency of clk1 and clk2 may be a half of the maximum operating frequency determined by the longest maximum-delay path, which may be timing path 130. In various embodiments, in the debug mode, when the frequency of clk1 and clk2 becomes a half of the frequency of clkin or lower, all maximum-delay paths may be restricted to toggling during one clock phase (e.g., high), whereas a data transition during another clock phase (e.g., low) may be identified as a minimum-delay violation by MDED 170. Note that a minimum-delay path toggling during the clock high phase corresponds to a non-violating minimum-delay path in this embodiment.

In some embodiments, MDEDs may be inserted at the capturing flip-flop at the end of all critically short data paths. Thus, these MDEDs may provide the knowledge of the exact locations of minimum-delay violations. In other embodiments, a MDED may be shared among several pipeline flip-flops capturing short data paths and being clocked by the same leaf of the clock tree. The latter approach may tell the approximate location of a minimum-delay violation and results in a smaller area overhead compared to the former approach. Therefore, these two approaches have tradeoffs between the knowledge of the exact minimum-delay error location and area overhead.

Minimum-delay errors are generally extremely difficult to identify and fix once a microprocessor or SoC product has been manufactured. Increased clock skew and degraded flip-flop hold time due to aging usually increase the risk of minimum-delay failures, even after conservative minimum-delay buffer insertion. Further, overly conservative buffer insertion may lead to unnecessarily high consumption of area and power.

In various embodiments, MDED 170 may be used to determine the exact location or the approximate location (e.g., in case of the MDED 170 being shared among several flip-flops) of minimum-delay violations, at different stages of the product lifetime, by periodically running a minimum-delay debug test. For example, an initial minimum-delay test may be conducted to ensure proper chip manufacturing, while subsequent tests account for aging effects. In some embodiments, MDED 170 may be used to assist apparatus 100 to repair the identified critical paths prone to minimum-delay violations. For example, in response to the detected MDE, minimum-delay buffers may be adaptively inserted to the critical data paths over the product lifetime, or delay elements may be adaptively inserted to the clock path of the launching flip-flop. Products with a mechanism to detect and repair minimum-delay errors may also enable power savings due to less conservative buffer insertion needed in those critical paths.

In various embodiments, MDED 170 may be used to determine, localize, and analyze minimum-delay problems in various products. The disclosed minimum-delay detector and debug mode may facilitate the development of a fundamental understanding of minimum-delay failures in real microprocessor products, running real applications, which in turn allows circumventing such failures in future products.

In various embodiments, apparatus 100 may be implemented differently from the example depicted in FIG. 1. As an example, MDED 170 may be implemented as an integrated sub-circuit of FF2 140. In various embodiments, components depicted in FIG. 1 may have a direct or indirect connection not shown in FIG. 1. As an example, there may be one or more additional data paths between FF1 110 and FF2 140, other than short timing path 120 or long timing path 130.

Figure 2:
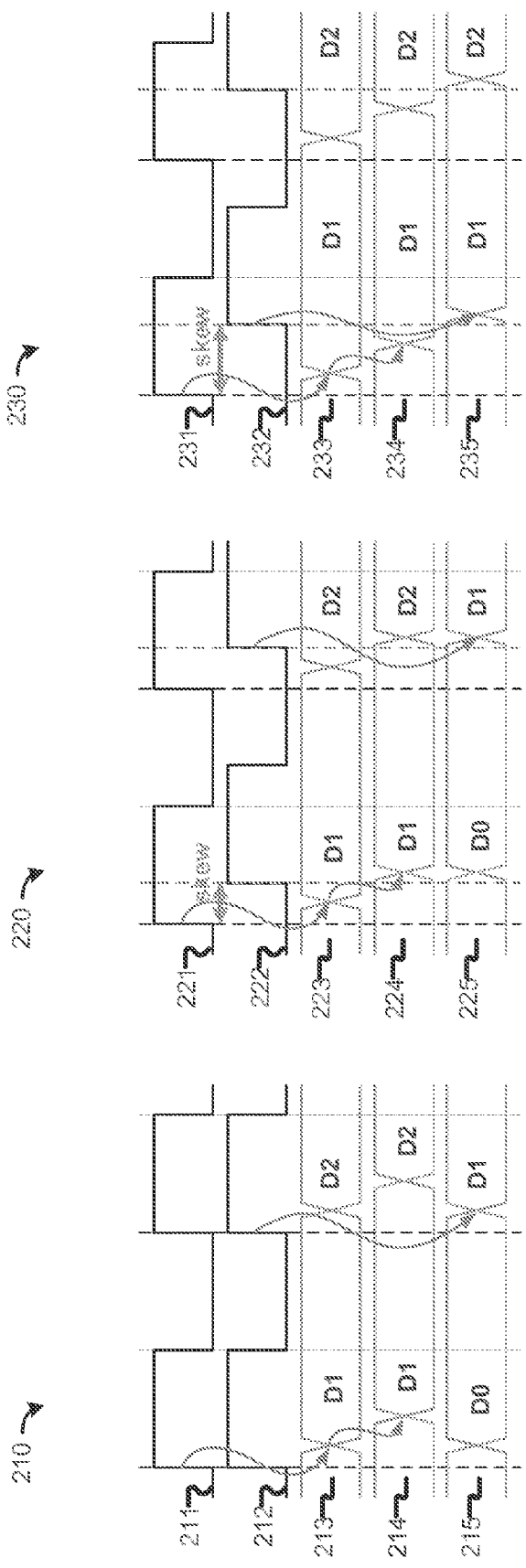
FIG. 2 is a set of example timing diagrams showing at least one pipeline operation with a minimum-delay error.

FIG. 2 is a set of example timing diagrams showing pipeline operations without MDE in diagrams 210 and 220, and a pipeline operation with a MDE in diagram 230. Diagram 210 shows zero clock skew. Diagram 220 shows a small clock skew. Diagram 230, however, shows a prohibitively large clock skew, which leads to a minimum-delay violation.

These timing diagrams correspond to different clock skew values, either avoiding or triggering a minimum-delay violation. In particular, diagram 210 shows the case of zero clock skew, in which case launching clock 211 and capturing clock 212 transition simultaneously. Here, data input 214 to the capturing flip-flop (e.g., FF2 140 of FIG. 1) has a delay from the data output 213 from the launching flip-flop (e.g., FF1 110 of FIG. 1). However, in the case of zero clock skew, data output 213 at the launching flip-flop (e.g., FF1 110 of FIG. 1) is still reflected at the data output 215 of the capturing flip-flop (e.g., FF2 140 of FIG. 1) only after the next rising clock edge, thus avoiding data race through.

Diagram 220 shows the case of a small clock skew, which slightly delays the capturing clock 222 with respect to the launching clock 221. Here, data input 224 to the capturing flip-flop (e.g., FF2 140 of FIG. 1) still has a delay from the data output 223 from the launching flip-flop (e.g., FF1 110 of FIG. 1). However, in the case of a small clock skew, data input 224 of the capturing flip-flop (e.g., FF2 140 of FIG. 1) still transitions after the positive edge of the capturing clock 222, and data is still captured correctly assuming that the hold time requirement of the capturing flip-flop is met. Thus, data output 225 of the capturing flip-flop still correctly reflects data output 223 at the launching flip-flop, with a clock latency of one.

Finally, diagram 230 shows the case of a large clock skew, which significantly delays the capturing clock 232 with respect to the launching clock 231. Here, data input 234 to the capturing flip-flop (e.g., FF2 140 of FIG. 1) still has a delay from the data output 233 from the launching flip-flop (e.g., FF1 110 of FIG. 1).

However, in the case of a large enough clock skew, data input 234 of the capturing flip-flop transitions before the positive edge of the capturing clock 232, which corresponds to a minimum-delay violation, thus corrupting data output 235 of the capturing flip-flop due to the early transition of data input 234. This erroneous situation may also be referred to as data race through since the data value D1 hold on the launching flip-flop appears on the capturing flip-flop one clock cycle too early. In various embodiments, an MDED (e.g., MDED 170 of FIG. 1) may identify such a minimum-delay violation by detecting a transition of data input 234 of the capturing flip-flop before the positive edge of the capturing clock 232.

Figure 3:
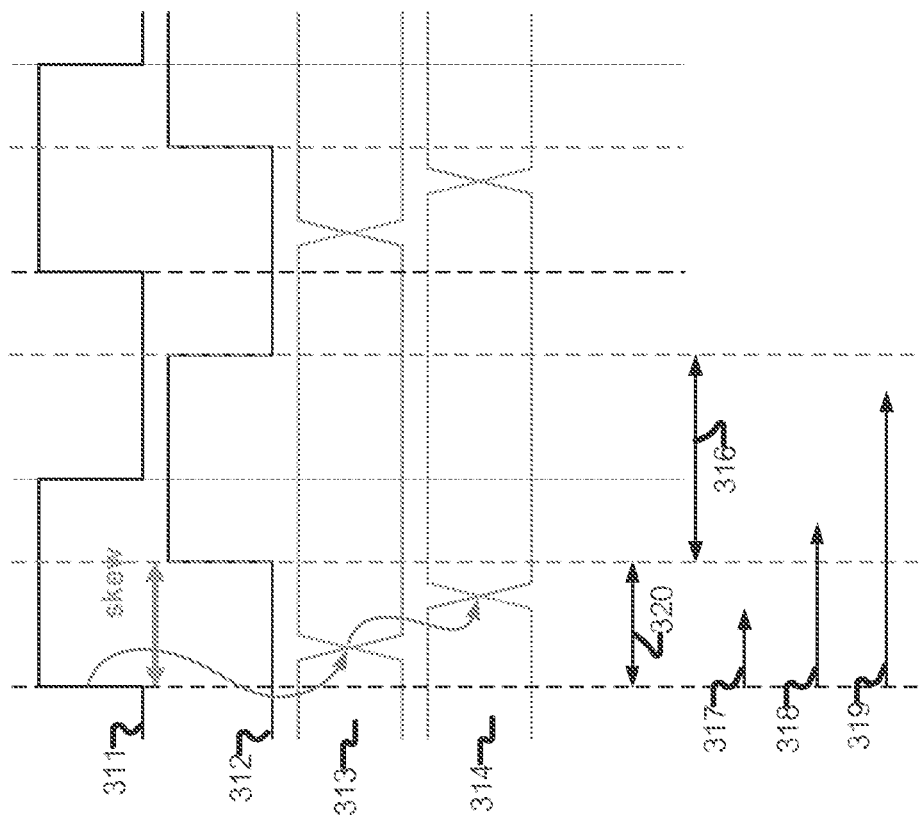
FIG. 3 is an example timing diagram in a minimum-delay debug mode, incorporating aspects of the present disclosure, in accordance with various embodiments.

FIG. 3 is an example timing diagram in a minimum-delay debug mode, incorporating aspects of the present disclosure, in accordance with various embodiments. In order to distinguish minimum-delay from maximum-delay paths, the clock frequency used in the minimum-delay debug mode may be reduced to be lower than or equal to a half of the clock frequency used in the normal operation mode. In the normal operation mode, the clock frequency may be set according to the maximum operating frequency determined by the critical maximum-delay path.

As illustrated in FIG. 3, in this embodiment, a reduced frequency used in the minimum-delay debug mode is half the value of the clock frequency used in the normal operation mode. There is a large clock skew, which significantly delays the capturing clock 312 with respect to the launching clock 311. Here, data input 314 to the capturing flip-flop (e.g., FF2 140 of FIG. 1) has a delay from the data output 313 from the launching flip-flop (e.g., FF1 110 of FIG. 1).

All maximum-delay paths, e.g., path 319, are restricted to toggling during the clock high phase 316 of the capturing clock 312, in the current embodiment. All minimum-delays toggling during the same clock high phase 316, such as path 318, correspond to non-violating minimum-delay paths.

However, in the case of a large enough clock skew, data input 314 of the capturing flip-flop transitions before the clock high phase 316, i.e., before the positive edge of the capturing clock 312, which corresponds to a minimum-delay violation. This minimum delay violation corrupts the data output of the capturing flip-flop (e.g., FF2 140 of FIG. 1) due to the early transition of data input 314.

Similarly, in various embodiments, an MDED (e.g., MDED 170 of FIG. 1) may identify whether path 317 violates the requisite minimum delay by detecting a transition of data input 314 of the capturing flip-flop before the positive edge of the capturing clock 312 or, equivalently, during the clock low phase 320.

Figure 4:
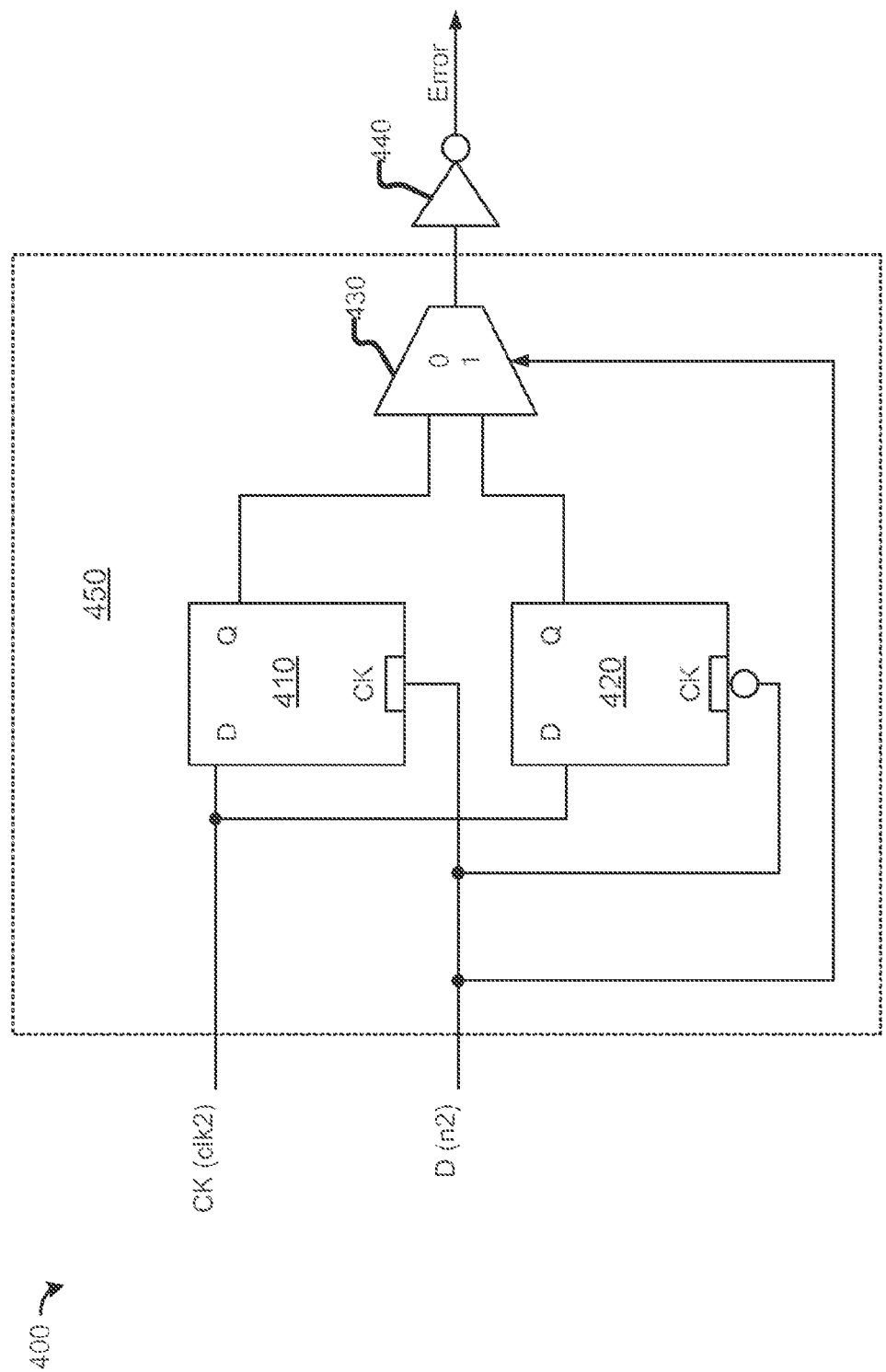
FIG. 4 is a schematic diagram of an example circuit for detecting minimum-delay errors, incorporating aspects of the present disclosure, in accordance with various embodiments.

FIG. 4 is a schematic diagram of an example circuit 400 for detecting minimum-delay errors, incorporating aspects of the present disclosure, in accordance with various embodiments. In various embodiments, circuit 400 may be included in MDED 170 of FIG. 1. In some embodiments, circuit 400 may include a dual-edge triggered flip-flop 450, which includes latch 410, latch 420, and output multiplexer 430. Further, circuit 400 may include inverter 440, connected to the dual-edge triggered flip-flop 450.

There are many possible circuit implementations of the MDED 170. In this embodiment, the dual-edge triggered flip-flop 450 is used to detect an erroneous data transition during a given clock phase, e.g., during the clock low phase in the following examples. In some embodiments, MDED 170 may use a purely combinatorial edge-detector, in conjunction with an optional latch to hold the error signal generated by the edge-detector.

The dual-edge triggered flip-flop 450 may include a transparent-on-high latch 410 and a transparent-on-low latch 420. In various embodiments, the output multiplexer 430 selects whichever latch is currently non-transparent from transparent-on-high latch 410 and transparent-on-low latch 420. The latches sample the current clock (e.g., clk2) phase whenever the data signal (e.g., n2) transitions. In the current embodiment, whenever a low clock phase is sampled, the active-high Error signal is asserted as inverter 440 inverts the output from the output multiplexer 430. In other embodiments, the Error signal may also be asserted whenever a high clock phase is sampled depending on the particular implementation.

In various embodiments, circuit 400 may be assembled from proven standard-cells, and avoids contention, dynamic data storage, and other reliability risks. In some embodiments, the area cost of circuit 400 may correspond roughly to the area of a basic master-slave flip-flop.

Figure 5:
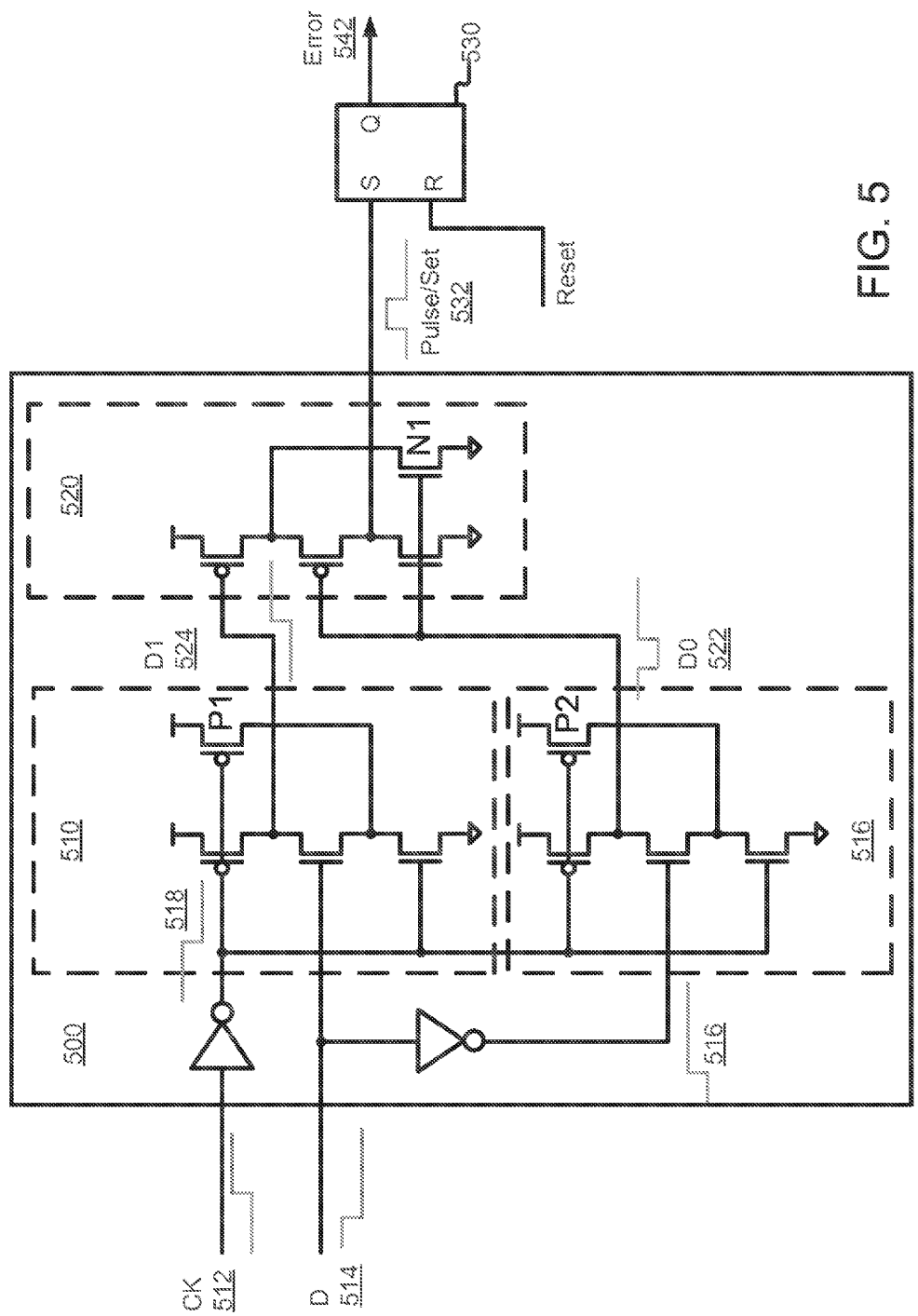
FIG. 5 is a schematic diagram of another example circuit for detecting minimum-delay errors, incorporating aspects of the present disclosure, in accordance with various embodiments.

FIG. 5 is a schematic diagram of another example circuit for detecting minimum-delay errors. In various embodiments, an MDED may include a dynamic edge detection circuit 500 with a static latch 530 for the error signal. In some embodiments, static latch 530 may be a Set-Reset (SR) latch. In various embodiments, dynamic edge detection circuit 500 may generate a pulse using dynamic Domino circuits. In FIG. 5, example waveforms of critical circuit nodes are also shown. In some embodiments, static complementary metal-oxide-semiconductor (CMOS) edge-detectors (not shown) may also be used in an MDED.

In various embodiments, circuit 500 may be included in MDED 170 of FIG. 1. In some embodiments, circuit 500 may use dynamic Domino logic and may be connected to a static latch, e.g., latch 530. In this embodiment, circuit 500 may include two first-level Domino stages (e.g., 510 and 516) and one second-level Domino stage (e.g., 520).

In one embodiment, whenever the clock signal (e.g., CK 512) is high, the outputs of all Domino stages (e.g., 510, 516, and 520) are pre-charged (e.g., D1 524 and D0 522) or pre-discharged (e.g., Pulse/Set 532). During the low phase of CK 512, i.e., when data D 514 transition causes a minimum-delay error, the output of one out of the two first-level Domino stages (e.g., D1 524) is discharged. If, and only if, data D 514 transitions while the clock is still low, the output of the other first-level Domino stage (e.g., D0 522) will be discharged as well. In turn, this will cause the output of the second-level Domino stage 520 to transition high for the remainder of the clock low phase (e.g., generate Pulse/Set 532), which in turn sets the static latch 530 and thereby generates an Error signal 542.

During the clock high phase, i.e., whenever data D 514 is allowed to transition without causing a minimum-delay error, the output nodes of the first-level Domino stages are pre-charged to high (e.g., to VCC), while the output of the second-level Domino stage is pre-discharged low (e.g., to VSS). Therefore, the Error signal 542 will never be asserted for a data transition occurring during the clock high phase.

The signal of Pulse/Set 532 is used to set latch 530, thereby asserting the error signal 542. In various embodiments, latch 530 may be reset initially, e.g., during power on or at the beginning of the minimum-delay debug mode.

The transistors P1, P2, and N1 may be used to pre-charge internal nodes of the evaluation networks to avoid level degradation at the output of each logic stage, which otherwise would occur due to charge sharing. In other embodiments, weak keepers (not shown in FIG. 5) may be added to avoid a minimum operating frequency requirement.

In various embodiments, the latch 530 may be reset at the beginning of the minimum-delay debug mode, and remains set (signaling an error) for the entire debug test after the first minimum-delay violation is detected. In some embodiments, the latch 530 could be reset after each clock cycle.

In various embodiments, an MDED (e.g., MDED 170) may use circuits 500 and 530 to detect minimum-delay errors. On the one hand, the total area of circuits 500 and 530 may be smaller than the area of circuit 400 shown in FIG. 4. On the other hand, circuit 500 may entail reliability concerns in the context of high-volume manufacturing, due to dynamic nodes, capacitive coupling onto these nodes, charge leakage, charge sharing, and other second-order effects.

Figure 6:
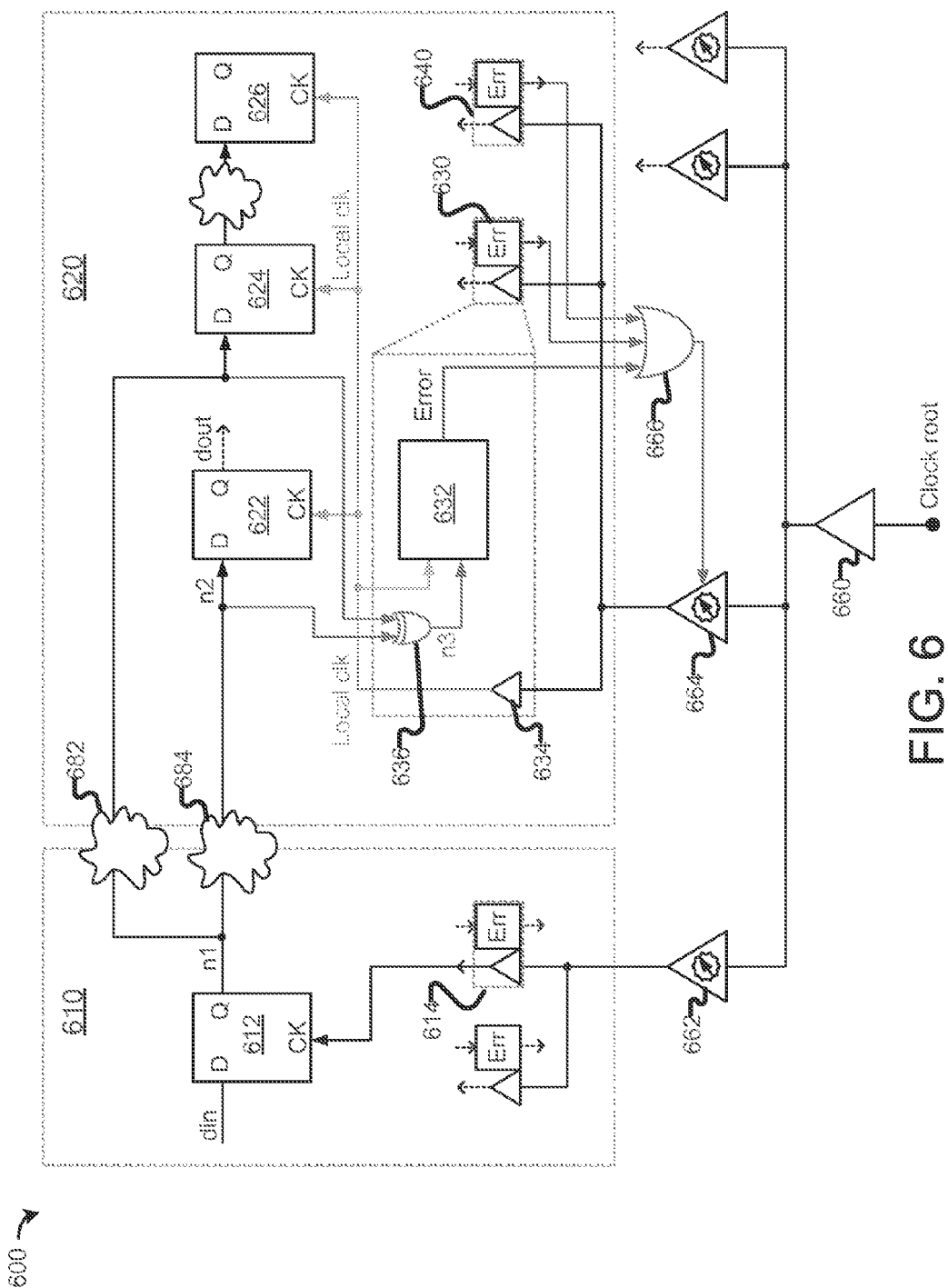
FIG. 6 is a schematic diagram of an example circuit for detecting and repairing minimum-delay errors, incorporating aspects of the present disclosure, in accordance with various embodiments.

FIG. 6 is a schematic diagram of an example circuit 600 for detecting and repairing minimum-delay errors, incorporating aspects of the present disclosure, in accordance with various embodiments. In various embodiments, minimum-delay failures may be repaired by reducing the clock insertion delay from the clock root to the capturing flip-flop, e.g., via a post-silicon tunable (PST) clock buffer. Therefore, circuit 600 may be used to repair minimum-delay failures after chip manufacturing, in order to re-establish correct chip functionality during the product lifetime in some embodiments. Accordingly, circuit 600 may be used to detect and repair minimum-delay failures, so as to significantly improve the reliability of complex microprocessors or SoCs, reduce area and power cost, and extend product lifetime.

In various embodiments, circuit 600 may use a shared minimum-delay error detector, e.g., MDED 632, per last-level local clock buffer (LCB), e.g., LCB 634. Circuit 600 may include clock region 610 and clock region 620 supplied by respective regional clock buffer (RCB) 662 and RCB 664. Clock region 610 may include minimum-delay error detection circuit 614 and flip-flop 612. Flip-flop 612 may receive data din, and may output data n1 to clock region 620. Data n1 may be transmitted via various different paths to a respective receiving sequential circuit in clock region 620. As an example, data n1 may travel via a given path among path group 684 to flip-flop 622. As another example, data n1 may travel via a given path among path group 682 to flip-flop 624.

In various embodiments, clock region 620 may host various components, such as flip-flops 622, 624, and 626, which are clocked by a common LCB 634. Clock region 620 may include many units of LCB and minimum-delay error detection circuit, such as circuit 630 and circuit 640. Circuit 630, as shown, may include an LCB (e.g., LCB 634) shared by several flip-flops, and an MDED (e.g., MDED 632). Further, circuit 630 may include an XOR gate (e.g., XOR gate 636) to receive data from two or more monitored data paths, and to provide a combined data transition signal to the MDED. In various embodiments, MDED 632 may be equal or similar to MDED 170 of FIG. 1, and include circuit 400 of FIG. 4 or circuit 500 of FIG. 5. MDED 632 may be used to detect minimum-delay errors in the monitored data paths.

The clock distribution network used in large microprocessor chips may include at least three levels: 1) a global or central clock buffer (CB) (e.g., CB 660) at the clock root or clock drop pin; 2) regional clock buffers (e.g., RCB 662 or RCB 664); and 3) local clock buffers (e.g., LCB 634) driving the leaf points of the clock tree. In various embodiments, post-silicon tunable (PST) clock buffers may be used at the regional level, e.g., for RCB 662 or RCB 664. Such PST clock buffers may be tuned on a per-die basis after chip manufacturing in order to minimize skew and improve the operating frequency since clock skew may develop due to immature transistor models, or new process stepping.

In various embodiments, circuit 600 may be used to repair minimum-delay failures, after such failures have been detected by an MDED, e.g., MDED 632. Regional PST clock buffers, e.g., RCB 664, may be re-used to repair minimum-delay failures. As an example, RCB 664 may be set to a medium or large delay initially. In case of the detection of a minimum-delay error by MDED 632, RCB 664 may then be set to a shorter delay to repair the MDE.

In various embodiments, several measures may be taken to reduce the area overhead caused by the minimum-delay error detection and self-repair scheme. In some embodiments, minimum-delay detection may be limited to inter-regional data paths, which are characterized by large clock skew between launching and capturing flip-flops. Both regional and local data paths suffer from a lower amount of clock skew and may therefore be handled in a conventional way, e.g., with conservative minimum-delay buffer insertion, while avoiding excessive minimum-delay detector insertion.

In some embodiments, to further reduce the area overhead of the self-repair scheme, a single minimum-delay detector may be shared by each local clock domain. As an example, MDED 632 may be shared by all flip-flops clocked by LCB 634. The shared MDED may flag an error if the data input of any one of the flip-flops, which capture an inter-regional data path and are located in the same local clock domain, transitions during a dedicated clock phase (e.g., the clock low phase in one embodiment). In some embodiments, a tree of XOR gates may be used to feed all flip-flop data inputs to the shared detector. In this case, a signal transition at the detector input is generated if at least one data input transitions. In such a low-overhead minimum-delay self-repair scheme, each local clock domain may have its own local clock buffer and MDED, and the clock signal from the local clock buffer may be directly fed to the MDED.

In various embodiments, the error outputs of multiple minimum-delay error detection circuits in a clock region (e.g., clock region 620) may be collected as a single feedback signal to RCB 664 via OR gate 666. In case of one or more minimum-delay errors in the clock region 620, the delay of RCB 664 may be reduced, until no further failures occur in this clock region. Note that the error feedback signals may be routed along the tracks of the clock tree, in opposite direction.

In various embodiments, circuit 600 may enable self-repair of minimum-delay failures during a min-delay debug mode. In some embodiments, circuit 600 may increase reliability under slowly varying PVT conditions, or in the presence of other noise sources, e.g., achieved by repeated minimum-delay correction cycles. In some embodiments, circuit 600 may help for higher manufacturing yield, e.g., achieved by one-time post-manufacturing minimum-delay repair. In some embodiments, circuit 600 may enable a longer product lifetime even in the occurrence of aging, e.g., achieved by repetitive minimum-delay self-repair.

Figure 7:
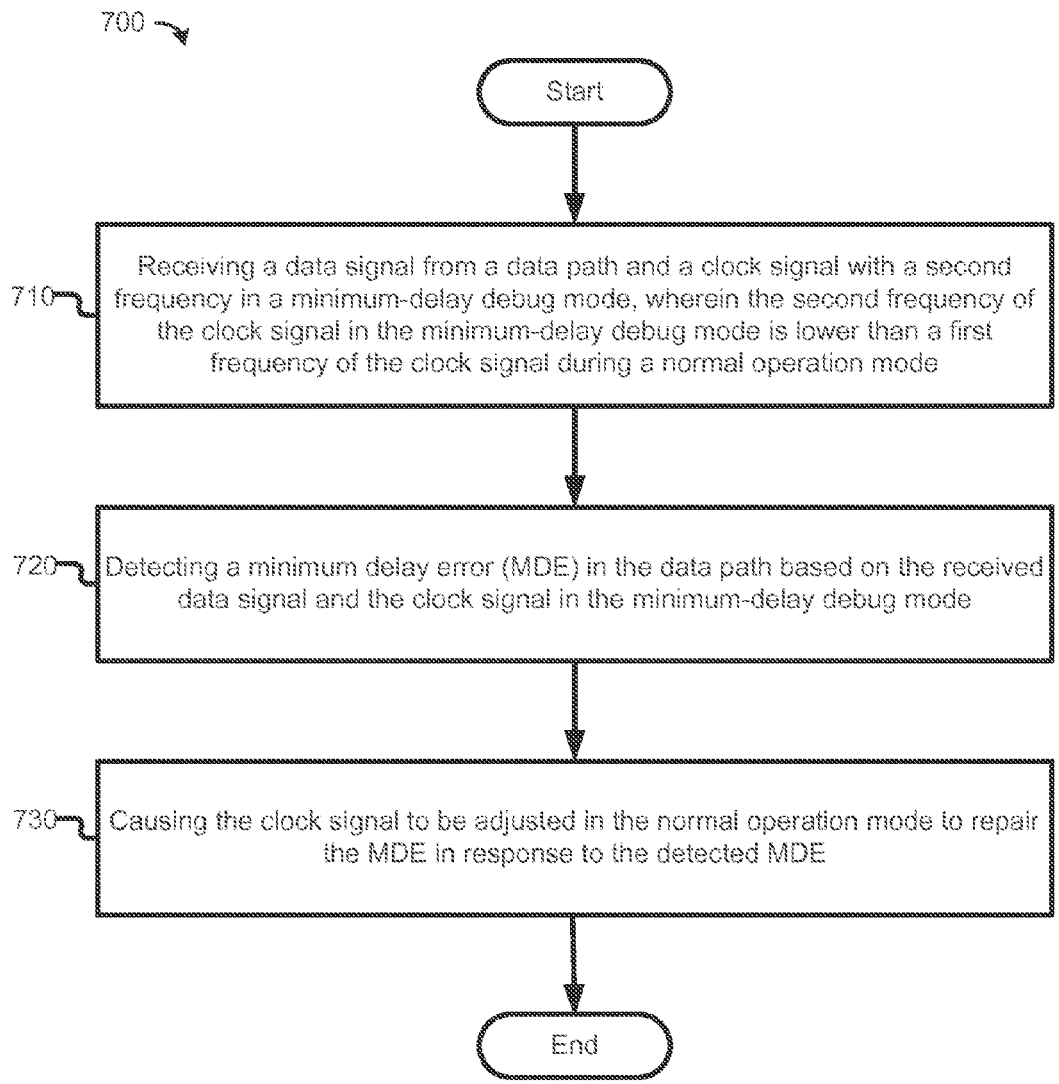
FIG. 7 is a flow diagram of an example process executable by an example apparatus for detecting and repairing minimum-delay errors, in accordance with various embodiments.

FIG. 7 is a flow diagram of an example process 700 executable by an example apparatus for detecting and repairing minimum-delay errors, in accordance with various embodiments. As shown, process 700 may be performed by a circuit (e.g., circuit 600 of FIG. 6) utilizing the design principal as disclosed herein to implement one or more embodiments of the present disclosure.

In some embodiments, at 710, the process 700 may include receiving, by a minimum-delay error detector (e.g., MDED 632 of FIG. 6 or MDED 170 of FIG. 1), a data signal from a data path and a clock signal with a second frequency in a minimum-delay debug mode. In some embodiments, the second frequency of the clock signal in the minimum-delay debug mode is lower than a first frequency of the clock signal during a normal operation mode. As an example, the clock signal output by CC 160 of FIG. 1 as the second frequency of the clock signal may be lower than the clock signal input to CC 160 of FIG. 1 as CC 160 may adjust the clock signal in the minimum-delay debug mode.

In some embodiments, at 720, the process 700 may include detecting, by the MDED, a minimum-delay error (MDE) in the data path based on the received data signal and the clock signal in the minimum-delay debug mode. As an example, MDED 632 of FIG. 6 may detect the MDE in the data path coupled to flip-flop 622 based on the data signal as well as the clock signal coupled to MDED 632.

In some embodiments, at 730, the process 700 may include causing, by the MDED, the clock signal to be adjusted in the minimum-delay debug mode or in the normal operation mode to repair the MDE in response to the detected MDE. As an example, after detecting an MDE, MDED 632 of FIG. 6 may cause RCB 664 of FIG. 6 to be adjusted to repair the MDE, e.g., by reducing the delay of RCB 664 until no further MDE occurs.

Figure 8:
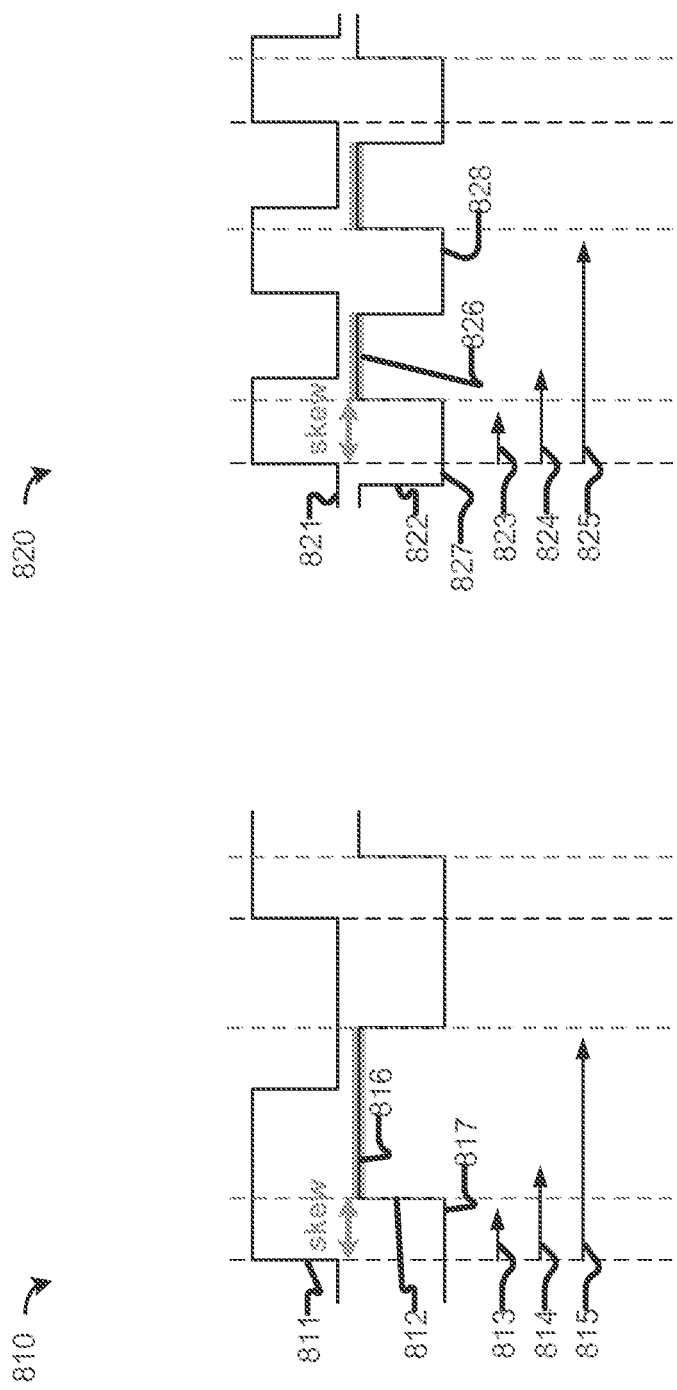
FIG. 8 is a set of example timing diagrams associated with an example circuit for detecting and repairing minimum-delay errors, incorporating aspects of the present disclosure, in accordance with various embodiments.

FIG. 8 illustrates some example timing diagrams associated with an example circuit, e.g., circuit 600 of FIG. 6, for detecting and repairing minimum-delay errors. Diagram 810 shows timing diagrams in a low-power mode with minimum-delay detection and repair capability, while diagram 820 shows time diagrams in a high-performance mode without minimum-delay detection and repair capability.

Modern microprocessors and SoCs often support dynamic voltage and frequency scaling (DVFS) or at least two separate operating modes, namely, a low-power (LP) and a high-performance (HP) mode. In the HP mode, the operating frequency may be set at or close to the maximum frequency, determined by the critical max-delay path. In order to not only result in power savings but simultaneously support minimum-delay detection and repair, the LP mode may be defined by an operating frequency that is half of the maximum frequency or lower.

In such an LP mode, an MDED, e.g., MDED 632 shown in FIG. 6, may detect an MDE as a data transition during a given clock phase (e.g., the clock low phase in some embodiments), and feed this error information to a PST clock buffer to circumvent the minimum-delay failure. In various embodiments, this minimum-delay detection and repair scheme may be conditioned on that there are no maximum-delay violations. In other words, in the LP mode, a maximum-delay path is allowed to toggle only during the clock phase that is not used for minimum-delay detection (e.g., the clock high phase in some embodiments).

Diagram 810 illustrates the capacity of the example circuit to detect minimum-delay errors in a minimum-delay error debug mode with a reduced clock frequency in reference to the clock frequency in the normal operating mode. There may be a large clock skew, which significantly delays the capturing clock 812 with respect to the launching clock 811.

The maximum-delay path 815 may be restricted to toggling during the clock high phase 816 of the capturing clock 812, in the current embodiment. The minimum-delay path 814 toggling during the same clock high phase 816 may correspond to a non-violating minimum-delay path. However, in the case of a large enough clock skew, data input of the capturing flip-flop may make a transition during the clock low phase 817, which corresponds to a minimum-delay violation. Thus, in various embodiments, an MDED (e.g., MDED 632 of FIG. 6) may identify the violating minimum-delay path 813 by detecting a transition of data input to the capturing flip-flop during the clock low phase in some embodiments.

Diagram 820 illustrates time diagrams in an HP mode. Similarly, a large clock skew here may significantly delay the capturing clock 822 with respect to the launching clock 821. However, in the HP mode, maximum-delay paths, e.g., path 825, may be toggled during the clock high phase 826 or the clock low phase 828 of the capturing clock 822. Meanwhile, minimum-delay paths, e.g., path 824, toggling during the clock high phase 826 may correspond to non-violating minimum-delay paths; however, the minimum-delay path 823 toggling during the clock low phase 827 corresponds to a minimum-delay violation. Thus, in the HP mode, both the maximum-delay path 825 and the minimum-delay path 823 may toggle during a clock low phase. In this case, MDED 632 of FIG. 6 may not be able to identify a violating minimum-delay path simply based on a transition of data input to the capturing flip-flop during the clock low phase.

In various embodiments, the previously discussed minimum-delay self-repair scheme may be performed during power-on, or continuously in the LP mode. In many cases, the frequency during self-repair may be at least two times lower than the maximum operating frequency. In some embodiments, a failure might not be triggered immediately during a minimum-delay debug mode, but only as soon as a specific data pattern is applied.

After successful detection of a minimum-delay error, several measures can be taken to repair this failure. One measure is to increase the delay of the data path affected by the minimum-delay error. Another measure is to delay the launching clock. Yet another measure may be to advance the capturing clock. However, at the capturing flip-flop where the minimum-delay failure was detected, it is hardly possible to know the launching clock. Adaptive buffer insertion needs to be repeated for every single violating minimum-delay path, whereas advancing only one capturing clock may repair several minimum-delay paths at once with lower area and power costs. Thus, in many embodiments, the approach of adjusting the capturing clock may be retained for minimum-delay self-repair.

Figure 9:
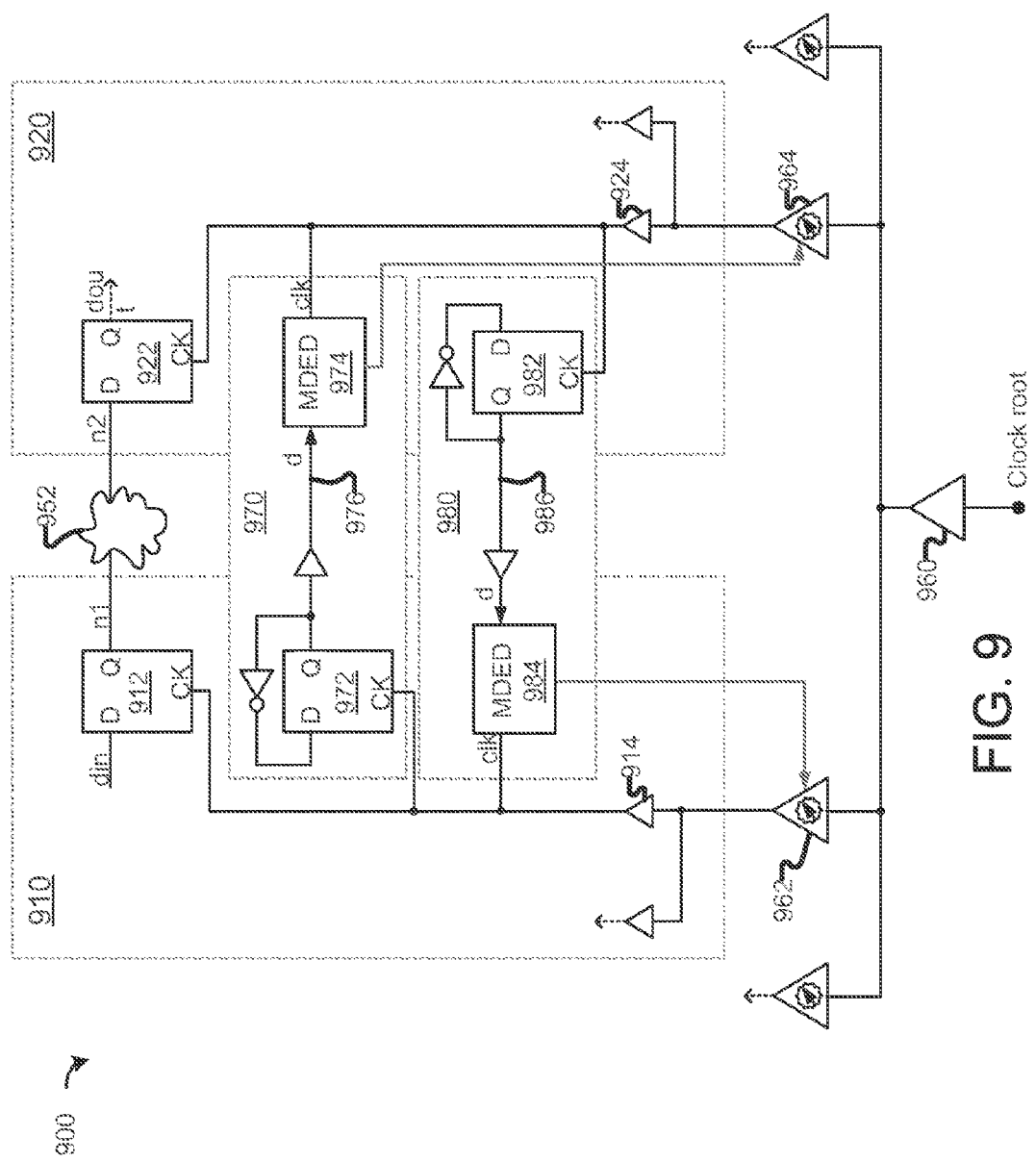
FIG. 9 is a schematic diagram of an example circuit with a minimum-delay path replica for detecting and repairing minimum-delay errors, incorporating aspects of the present disclosure, in accordance with various embodiments.

FIG. 9 is a schematic diagram of an example circuit 900 with a minimum-delay path replica for detecting and repairing minimum-delay errors, incorporating aspects of the present disclosure, in accordance with various embodiments.

In various embodiments, a minimum-delay error self-repair scheme may be based on minimum-delay path replicas. In this embodiment, circuit 900 may include flip-flop 912 in clock domain 910 commutatively coupled to flip-flop 922 in clock domain 920 via one or more data paths 952. Further, circuit 900 may use replica and error detector circuit (REDC) 970 and REDC 980, for minimum-delay detection and self-repair between clock domain 910 and clock domain 920.

In various embodiments, circuit 900 may be used in a pattern-independent or data-independent minimum-delay error self-repair scheme. In various embodiments, such a minimum-delay error self-repair scheme may be used at the maximum operating frequency (e.g., in an HP mode), and also at runtime without a special debug mode. Compared to the previous disclosed scheme based on local minimum-delay violation detection, the scheme based on minimum-delay path replicas may have lower area and power cost.

In circuit 900, clock domain 910 is coupled to its PST RCB 962, while clock domain 920 is coupled to its PST RCB 964. PST RCB 962 and PST RCB 964 may receive a common clock signal from global clock buffer (GCB) 960. The first REDC 970 has a minimum-delay path replica (MDPR) 976, which has a delay equal to or slightly shorter than the shortest data path of path group 952 from clock region 910 to clock region 920. Similarly, the second REDC 980 has another MDPR 986, which is designed to mimic the shortest data path in the reverse direction. In various embodiments, only two REDCs per pair of clock domains may be needed for this minimum-delay error self-repair scheme, which results in a much lower area overhead compared to the scheme (e.g., in FIG. 6) with one MDED per LCB.

In various embodiments, to quickly find minimum-delay errors, a launching flip-flop (e.g., 972 or 982) feeding the MDPRs may be toggled every clock cycle. At the capturing end, it is sufficient to have an MDED (e.g., MDED 974 or 984) without a capturing flip-flop. In fact, to account for non-zero hold times of pipeline flip-flops, the local clock signal fed to the MDED 984, coming from LCB 914, or the local clock signal fed to the MDED 974, coming from LCB 924, may be slightly delayed. In case of detection of a minimum-delay error in a given clock region, the PST RCB (e.g., 964 or 962) driving that clock region may be set to a shorter delay, such that the minimum-delay error may be eliminated.

In some embodiments, the minimum-delay self-repair enabled by circuit 900 may be applied to an entire batch of chips after manufacturing, to find a set of PST delay values that maximize the manufacturing yield by avoiding minimum-delay failures. In some embodiments, circuit 900 may enable an automatic built-in self-repair during power-on of each individual chip. In some embodiments, the minimum-delay self-repair scheme may be executed whenever parts of the microprocessor or SoC are inactive (e.g., during clock gating, power gating, DVFS adjustment, etc.). In some embodiments, a minimum-delay self-repair scheme based on minimum-delay path replicas may even be performed continuously at full speed while the microprocessor or SoC is running.

Figure 10:
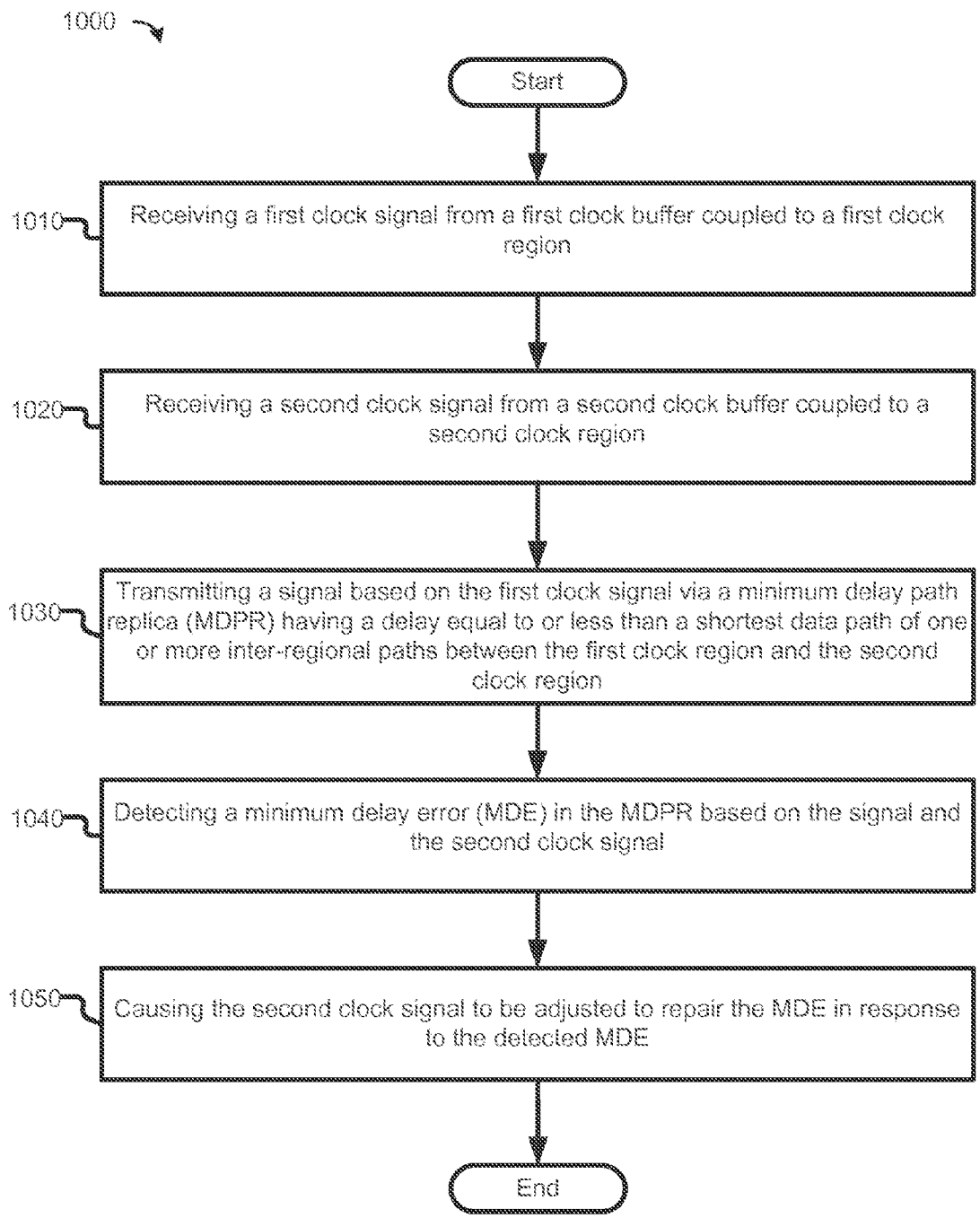
FIG. 10 is a flow diagram of an example process executable by an example apparatus with a minimum-delay path replica for detecting and repairing minimum-delay errors, incorporating aspects of the present disclosure, in accordance with various embodiments.

FIG. 10 is a flow diagram of an example process 1000 executable by an example apparatus with a minimum-delay path replica for detecting and repairing minimum-delay errors in accordance with various embodiments. In some embodiments, process 1000 may be performed by a circuit, e.g., circuit 900 of FIG. 9, utilizing the design principal as disclosed herein to implement one or more embodiments of the present disclosure.

In some embodiments, at 1010, the process 1000 may include receiving a first clock signal from a first clock buffer coupled to a first clock region, e.g., by REDC 970 or 980 of FIG. 9. As an example, in FIG. 9, REDC 970 may receive a clock signal from local clock buffer 914 in clock domain 910.

In some embodiments, at 1020, the process 1000 may include receiving, by the REDC, a second clock signal from a second clock buffer coupled to a second clock region. As an example, in FIG. 9, REDC 970 may receive another clock signal from local clock buffer 924 in clock domain 920.

In some embodiments, at 1030, the process 1000 may include transmitting, by the REDC, a signal based on the first clock signal via a minimum-delay path replica (MDPR) having a delay equal to or less than the shortest data path of one or more inter-regional paths between the first clock region and the second clock region. As an example, MDED 974 in REDC 970 may receive a data signal originating in clock domain 910, synchronized with the clock derived from local clock buffer 914, transmitted to MDED 974 via MDPR 976. Further, MDED 974 in REDC 970 may receive a clock signal derived from local clock buffer 924 in clock domain 920.

In some embodiments, at 1040, the process 1000 may include detecting, by the MDED, a minimum-delay error (MDE) in the MDPR based on the transmitted data signal and the second clock signal. As an example, MDED 974 may detect MDEs in the MDPR 976 based on the signal d received from flip-flop 972 and the clock signal clk received from the local clock buffer 924.

In various embodiments, the MDE may be detected when all clock signals are at a full speed in a normal mode of data transmission between the first clock region and the second clock region. As an example, MDED 974 may detect MDEs in the MDPR 976 even if clock domains 910 and 920 run at full speed in an HP mode.

In various embodiments, circuit 900 may detect and repair minimum-delay errors which may be triggered at some point during normal operation in path group 952 or in any other path group from clock domain 910 to clock domain 920, or vice-versa, before these errors actually occur. In fact, minimum-delay paths in path group 952, or in any other path group between clock domains 910 and 920, may be seldom triggered, e.g., requiring many operation cycles to find the MDE(s). However, it may take only two cycles, which can be performed at normal operation frequency, to transmit data '1' and then data '0' via MDPR 976 and MDPR 986 to anticipate MDEs in data paths and repair them even before they arise.

In various embodiments, detecting an MDE may be based on a data transition at a predetermined clock phase of the second clock signal. As an example, MDED 974 may include circuit 400 or circuit 500 to detect MDEs based on a data transition at a predetermined clock phase (e.g., either low or high) of the clock signal from the local clock buffer 924.

In some embodiments, at 1050, the process 1000 may include causing, by the MDED in the REDC, the clock signal of a clock domain to be adjusted to repair the MDE in response to the detected MDE. As an example, in FIG. 9, REDC 970 may cause RCB 964 to be adjusted to repair the MDE. In various embodiments, the delay of RCB 964 may be shortened to repair the MDE.

Figure 11:
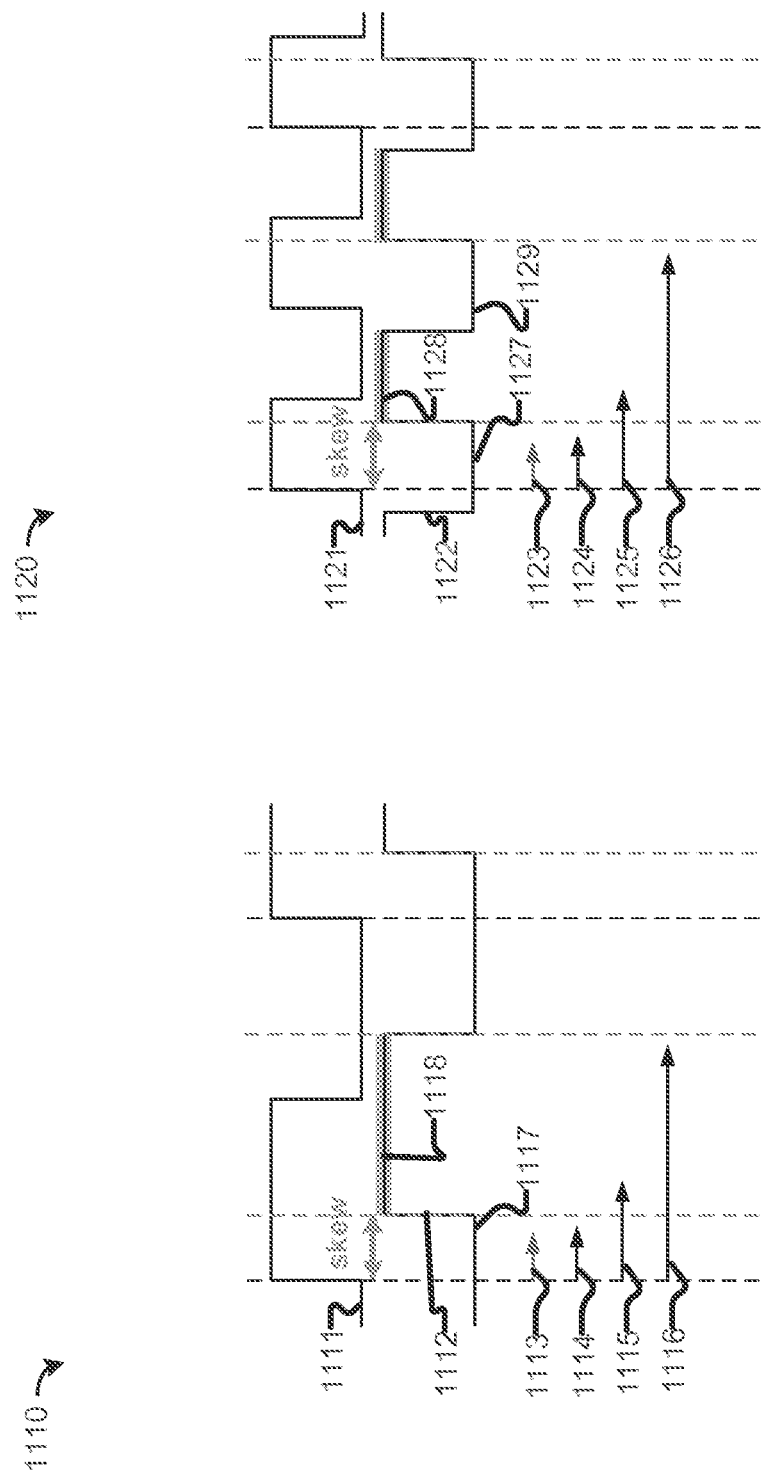
FIG. 11 is a set of example timing diagrams associated with an example apparatus with a minimum-delay path replica for detecting and repairing minimum-delay errors, incorporating aspects of the present disclosure, in accordance with various embodiments.

FIG. 11 illustrates some example timing diagrams associated with an example apparatus with a minimum-delay path replica and an MDED for detecting and repairing minimum-delay errors, incorporating aspects of the present disclosure, in accordance with various embodiments.

Diagram 1110 illustrates timing diagrams of a minimum-delay replica repair scheme in detecting minimum-delay errors with a reduced clock frequency in reference to the clock frequency in the normal operating mode. Diagram 1120 illustrates timing diagrams of the minimum-delay replica repair scheme in detecting minimum-delay errors with the unchanged clock frequency in the normal operating mode.

In diagram 1110, a large clock skew may significantly delay the capturing clock 1112 with respect to the launching clock 1111. The maximum-delay path 1116 may be restricted to toggling during the clock high phase 1118 of the capturing clock 1112, in this embodiment. The minimum-delay path 1115 toggling during the same clock high phase 1118 may correspond to a non-violating minimum-delay path. However, in the case of a large enough clock skew, data input of the capturing flip-flop may make a transition during the clock low phase 1117, which corresponds to a minimum-delay violation. Thus, in various embodiments, an MDED (e.g., MDED 974 of FIG. 9) may identify the violating minimum-delay path 1114 by detecting a transition of data input to MDED 974 during the clock low phase 1117 because the delay of the replica path 1113 is equal to or slightly shorter than the delay of the shortest inter-regional data path.

Diagram 1120 illustrates timing diagrams in an HP mode. Similarly, a large clock skew here may significantly delay the capturing clock 1122 with respect to the launching clock 1121. In the HP mode, the minimum-delay path 1125 may be toggled during the clock high phase 1128. However, the maximum-delay path 1126 may be toggled during the clock high phase 1128 or the clock low phase 1129 of the capturing clock 1122. However, in various embodiments, an MDED (e.g., MDED 974 of FIG. 9) may still identify the violating minimum-delay path 1124 by detecting a transition of data input to MDED 974 during the clock low phase 1127 because the delay of the replica path 1123 is equal to or slightly shorter than the delay of the shortest inter-regional data path.

Since the delay of the replica path is equal to or slightly shorter than the delay of the shortest inter-regional data path, the delay of the replica path may be shorter than half a clock period, even for operation at maximum frequency. Therefore, minimum-delay self-repair may be performed during the LP mode or the HP mode. Consequently, if desired, the minimum-delay self-repair may be carried out continuously at runtime, during any normal mode of operation, even at full speed.

In various embodiments, two clock cycles may be enough to stimulate the replica path with both a falling and a rising data transition, whereas many cycles might be required by circuit 600 of FIG. 6 to trigger the worst-case data path. Further, the replica based minimum-delay self-repair may have lower area overhead than the scheme shown in FIG. 6. Additionally, the replica based minimum-delay self-repair is data pattern independent, supports the maximum operating frequency, and can be carried out at runtime.

Figure 12:
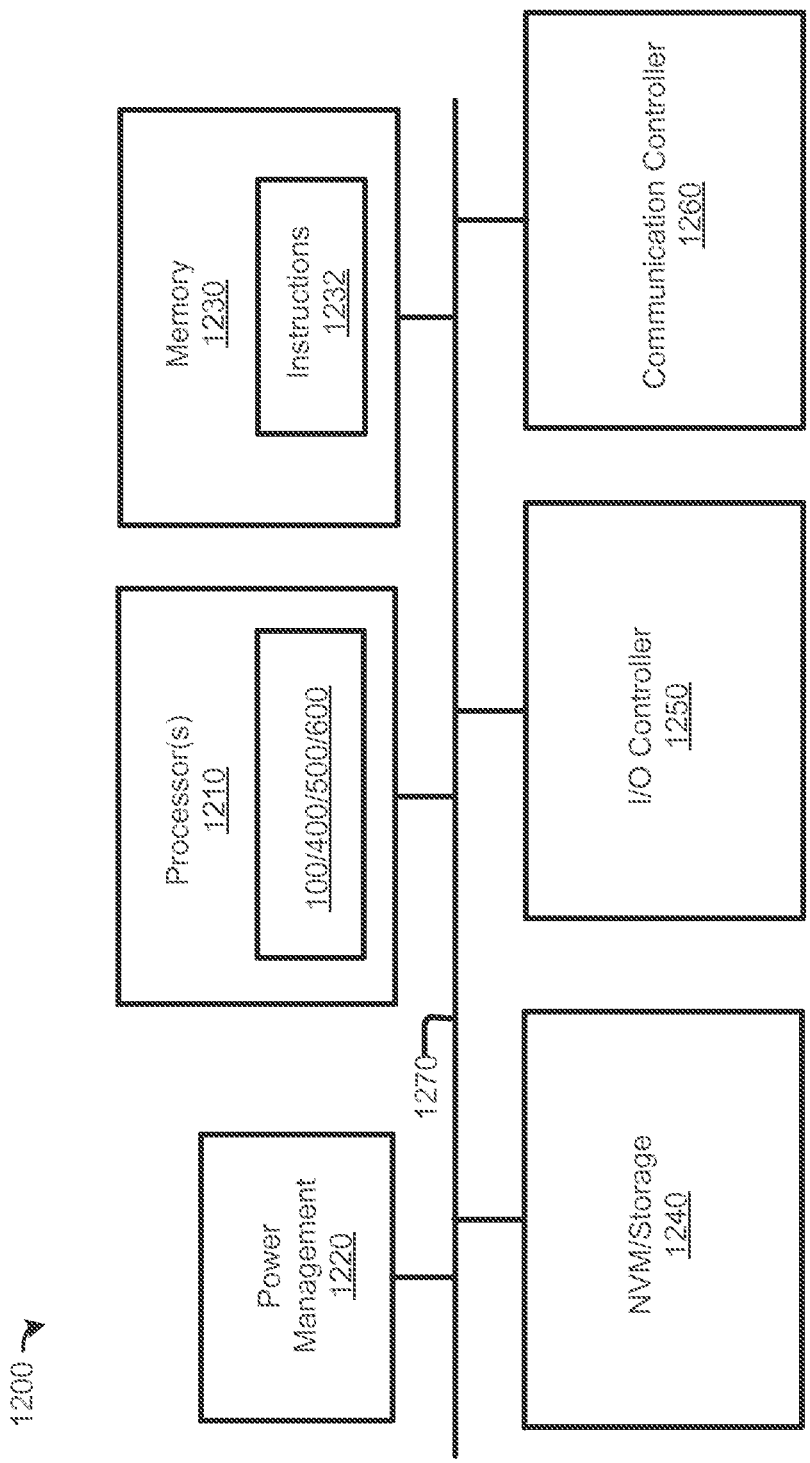
FIG. 12 is a block diagram that illustrates an example computer device suitable for practicing the disclosed embodiments, in accordance with various embodiments.

FIG. 12 is a block diagram that illustrates an example computer system 1200 suitable for practicing the disclosed embodiments with any of the design principles described with reference to FIGS. 1-11, in accordance with various embodiments. In one embodiment, computer system 1200 represents a mobile computing device, such as a computing tablet, a mobile phone or smartphone, a wireless-enabled e-reader, or another wireless mobile device. In other embodiments, computer system 1200 may be a laptop computer, a desktop computer, or a server. It will be understood that certain components are shown generally, and not all components of such a device are shown in computing system 1200.

As shown, computer system 1200 may include a power management 1220; a number of processors or processor cores 1210, a system memory 1230 having processor-readable and processor-executable instructions 1232 stored therein, a non-volatile memory (NVM)/storage 1240, an I/O controller 1250, and a communication controller 1260. For the purpose of this application, including the claims, the terms "processor" and "processor cores" may be considered synonymous, unless the context clearly requires otherwise. Those elements of FIG. 12 having the same reference numbers (or names) as the elements of any other figure can operate or function in any manner similar to that described, but are not limited to such.

In one embodiment, processors 1210 may include one or more physical devices, such as microprocessors, application processors, microcontrollers, programmable logic devices, or other processing means. The processing operations performed by processors 1210 may include the execution of an operating platform or operating system on which applications and/or device functions are executed. The processing operations may include operations related to input/output (I/O) with a human user or with other devices, operations related to power management, and/or operations related to connecting the computing system 1200 to another device. The processing operations may also include operations related to audio I/O and/or display I/O. In embodiments, processors 1210 may include circuits for detecting or repairing minimum-delay errors described in this disclosure. In embodiments, processors 1210 may include circuits for executing process 700 of FIG. 7 or process 1000 of FIG. 10 described in this disclosure.

The one or more NVM/storage 1240 and/or the system memory 1230 may comprise a tangible, non-transitory computer-readable storage device (such as a diskette, hard drive, compact disc read only memory (CD-ROM), hardware storage unit, flash memory, phase change memory (PCM), solid-state drive (SSD) memory, and so forth). Instructions 1232 stored in system memory 1230 and/or NVM/storage 1240 may be executable by one or more of the processors 1210. Instructions 1232 may contain particular instructions of an operating system and one or more applications.

Computer system 1200 may also include input/output devices (not shown) coupled to computer system 1200 via I/O controller 1250. I/O controller 1250 illustrates a connection point for additional devices that connect to computing system 1200 through which a user might interact with the system. For example, various devices that may be coupled to the computer system 1200 via I/O controller 1250 may include microphone devices, speaker or stereo systems, video systems or other display devices, keyboard or keypad devices, or other I/O devices for use with specific applications such as card readers or other devices.

In embodiments, communication controller 1260 may provide an interface for computing system 1200 to communicate over one or more network(s) and/or with any other suitable device. Communication controller 1260 may include any suitable hardware and/or firmware, such as a network adapter, one or more antennas, wireless interface(s), and so forth. In various embodiments, communication controller 1260 may include an interface for computing system 1200 to use near field communication (NFC), optical communications, or other similar technologies to communicate directly (e.g., without an intermediary) with another device. In various embodiments, communication controller 1260 may interoperate with radio communications technologies such as, for example, Wideband Code Division Multiple Access (WCDMA), Global System for Mobile Communications (GSM), Long Term Evolution (LTE), WiFi, Bluetooth®, Zigbee, and the like.

The various elements of FIG. 12 may be coupled to each other via a system bus 1270, which represents one or more buses. In the case of multiple buses, they may be bridged by one or more bus bridges (not shown). Data may pass through the system bus 1270 through the I/O controller 1250, for example, between an output terminal and the processors 1210.

System memory 1230 and NVM/storage 1240 may be employed to store a working copy and a permanent copy of the programming instructions implementing one or more operating systems, firmware modules or drivers, applications, and so forth, herein collectively denoted as instructions 1232. In various embodiments, instructions 1232 may include instructions for executing process 700 of FIG. 7 or process 1000 of FIG. 10 described in this disclosure, to detect or repair minimum-delay errors. The permanent copy of the programming instructions may be placed into permanent storage in the factory, or in the field, via, for example, a distribution medium (not shown), such as a compact disc (CD), or through the communication controller 1260 (from a distribution server (not shown)).

In various embodiments, processors 1210 may include apparatus 100 of FIG. 1, circuit 400 of FIG. 4, circuit 500 of FIG. 5, circuit 600 of FIG. 6, and/or circuit 900 of FIG. 9. In various embodiments, processors 1210 may include a minimum-delay error detector to facilitate detecting or repairing minimum-delay errors.

Similarly, memory 1230, NVM/storage 1240, I/O controller 1250, communication controller 1260, or even the Power Management 1220 control circuits may also include a minimum-delay error detector to facilitate detecting or repairing minimum-delay errors, for example, by including apparatus 100 of FIG. 1, circuit 400 of FIG. 4, circuit 500 of FIG. 5, circuit 600 of FIG. 6, and/or circuit 900 of FIG. 9.

In some embodiments, at least one of the processor(s) 1210 may be packaged together with I/O controller 1250 to form a System in Package (SiP). In some embodiments, at least one of the processor(s) 1210 may be integrated on the same die with I/O controller 1250. In some embodiments, at least one of the processor(s) 1210 may be integrated on the same die with I/O controller 1250 to form a System on Chip (SoC).

According to various embodiments, one or more of the depicted components of the system 1200 and/or other element(s) may include a keyboard, LCD screen, non-volatile memory, multiple antennas, graphics processor, application processor, speakers, or other associated mobile device elements, including a camera. The remaining constitution of the various elements of the computer system 1200 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments that have been described above may be modified without departing from the teachings in connection with FIGS. 1-12. These and other modifications can be made in light of the above detailed description. The terms used in the following claims should not be construed to be limited to the specific embodiments disclosed in the specification.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is always only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications, and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to the implementation of such block diagram arrangements are highly dependent upon the platform within which the present disclosure is to be implemented (i.e., such specifics should be well within the purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus, which may include a clock circuit to receive a first clock signal with a first frequency in a normal operation mode, and further output a second clock signal with a second frequency in a minimum-delay debug mode, wherein the second frequency in the minimum-delay debug mode is lower than the first frequency in the normal operation mode. The apparatus may further include a minimum-delay error detector (MDED), coupled to the clock circuit, to receive a data signal from a data path and the second clock signal and to detect a minimum-delay error (MDE) in the data path based on the received data signal and the second clock signal in the minimum-delay debug mode.

Example 2 may include the subject matter of Example 1, and may further include a clocked storage circuit, coupled to the clock circuit, to receive the data signal and the first clock signal with the first frequency during the normal operation mode, and to receive the data signal and the second clock signal with the second frequency during the minimum-delay debug mode.

Example 3 may include the subject matter of Example 1 or 2, and may further specify that the MDED includes a dual-edge triggered flip-flop.

Example 4 may include the subject matter of Example 3, and may further specify that the dual-edge triggered flip-flop includes a transparent-on-high latch, a transparent-on-low latch, and an output multiplexer, the transparent-on-high latch and the transparent-on-low latch to receive the data signal at respective clock terminals and to receive the clock signal at respective data terminals.

Example 5 may include the subject matter of Example 4, and may further specify that the output multiplexer is to receive the data signal, and is to select an output from a non-transparent latch selected from the transparent-on-high latch and the transparent-on-low latch.

Example 6 may include the subject matter of Example 5, and may further specify that the MDED further includes an inverter, coupled to the multiplexer, to output an error signal for the MDE in response to a predetermined clock phase sampled by the dual-edge triggered flip-flop.

Example 7 may include any subject matter of Examples 1-6, and may further specify that the MDED includes dynamic Domino logic and a static latch coupled to the Domino logic.

Example 8 may include the subject matter of Example 7, and may further specify that the Domino logic includes a plurality of first-level stages and a second-level stage coupled to the plurality of first-level stages; wherein the plurality of first-level stages and the second-level stage are pre-charged or pre-discharged during a first phase of the second clock signal; and wherein the second-level stage is to generate a MDE flag when the data signal changes state during a second phase of the second clock signal.

Example 9 may include the subject matter of Example 7 or 8, and may further specify that the static latch is to remain set in response to the detected MDE until a system reset.

Example 10 may include any subject matter of Examples 1-9, and may further include a clock buffer, coupled to the MDED, to adjust the clock signal to repair the MDE in response to the detected MDE.

Example 11 may include the subject matter of Example 10, and may further specify that the clock buffer is a post-silicon tunable (PST) clock buffer; and wherein the PST clock buffer is to shorten a delay to the clock signal when the minimum-delay error is detected.

Example 12 may include the subject matter of Example 10 or 11, and may further specify that the clock buffer is a regional clock buffer (RCB); wherein the RCB is coupled to the minimum-delay detector and at least another minimum-delay detector in a clock domain clocked by the RCB; and wherein the RCB is to shorten a delay to the clock signal based on the minimum-delay error detected by the minimum-delay detector or another minimum-delay error detected by at least another minimum-delay detector.

Example 13 may include any subject matter of Examples 1-12, and may further specify that the second frequency of the second clock signal is lower than or equal to a half of the first frequency.

Example 14 may include any subject matter of Examples 1-13, and may further specify that the MDED is to detect the MDE in the data path based on a data transition at a predetermined clock phase of the second clock signal.

Example 15 is a system, which may include a first regional clock buffer (RCB) and a second RCB coupled to the first RCB; a first circuitry, coupled to the first RCB, to receive a first clock signal from the first RCB; a second circuitry, coupled to the first circuitry and the second RCB, to receive a data signal from the first circuitry via one or more inter-regional paths, and to receive a second clock signal from the second RCB; and a third circuitry, coupled to the first circuitry and the second circuitry, comprising a minimum-delay error detector (MDED) and a minimum-delay replica path (MDRP) having a delay equal to or shorter than a shortest data path of the one or more inter-regional paths, the MDED to detect a minimum-delay error (MDE) of the MDRP based on the first clock signal and the second clock signal.

Example 16 may include the subject matter of Example 15, and may further specify that the third circuitry further includes a flip-flop coupled to the MDRP, wherein the flip-flop is to be toggled for every clock cycle of the first clock signal.

Example 17 may include the subject matter of Example 15 or 16, and may further specify that the MDED includes a dual-edge triggered flip-flop including an output multiplexer, and an inverter coupled to the dual-edge triggered flip-flop to output an error signal for the MDE in response to a predetermined clock phase sampled by the dual-edge triggered flip-flop.

Example 18 may include any subject matter of Examples 15-17, and may further specify that the MDED includes dynamic Domino logic and a static latch coupled to the Domino logic; wherein the Domino logic comprises a plurality of first-level stages and a second-level stage coupled to the plurality of first-level stages; wherein the plurality of first-level stages and the second-level stage are pre-charged or pre-discharged during a first phase of the second clock signal; and wherein the second-level stage is to generate an MDE signal in response to the data signal changing its value during a second phase of the second clock signal.

Example 19 may include any subject matter of Examples 15-18, and may further specify that the second RCB is to adjust the second clock signal to repair the MDE in response to the detected MDE.

Example 20 may include any subject matter of Examples 15-19, and may further specify that the third circuitry further includes another MDED and another MDPR having another delay equal to or shorter than another shortest data path of one or more inter-regional paths from the second circuitry to the first circuitry, the another MDED to detect another MDE of the another MDPR; and wherein the first RCB is to adjust the first clock signal to repair the another MDE in response to the detected another MDE.

Example 21 is a method for detecting or repairing minimum-delay errors, which may include receiving, by a replica and error detection circuit (REDC), a first clock signal from a first clock buffer coupled to a first clock region; receiving, by the REDC, a second clock signal from a second clock buffer coupled to a second clock region; transmitting, by the REDC, a data signal synchronized with the first clock signal via a minimum-delay path replica (MDPR) having a delay equal to or less than a shortest data path of one or more inter-regional data paths between the first clock region and the second clock region; detecting, by an minimum-delay error detector (MDED) of the REDC, a minimum-delay error (MDE) in the MDPR based on the transmitted data signal and the second clock signal; and adjusting, by the REDC, the second clock signal to repair the MDE in response to the detected MDE.

Example 22 may include the subject matter of Example 21, and may further specify that detecting includes detecting the MDE when the first and the second clock signals are at a full speed in a normal mode of data transmission between the first clock region and the second clock region.

Example 23 may include the subject matter of Example 21 or 22, and may further specify that detecting comprises detecting, by the REDC, the MDE in the MDPR before another MDE is triggered on the shortest data path in a normal mode of data transmission between the first clock region and the second clock region.

Example 24 may include any subject matter of Examples 21-23, and may further specify that adjusting includes shortening a delay to the second clock signal.

Example 25 may include any subject matter of Examples 21-24, and may further specify that detecting includes detecting a data transition at a predetermined clock phase of the second clock signal Example 26 is at least one storage medium, which may include a plurality of instructions configured to cause an apparatus, in response to execution of the instructions by the apparatus, to practice any subject matter of Examples 21-25.

Example 27 is an apparatus, which may include means to practice any subject matter of Examples 21-25.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
a clock circuit to receive a first clock signal with a first frequency and to output a second clock signal, wherein the clock circuit is to output the second clock signal with the first frequency in a normal operation mode, and wherein the clock circuit is to output the second clock signal with a second frequency in a minimum-delay debug mode, wherein the second frequency in the minimum-delay debug mode is lower than the first frequency in the normal operation mode; and a minimum-delay error detector (MDED), coupled to the clock circuit, to receive a data signal from a data path, to receive the second clock signal, and to detect a minimum-delay error (MDE) in the data path based on the received data signal and the second clock signal in the minimum-delay debug mode; and a clocked storage circuit, coupled to the clock circuit, to receive the data signal and the second clock signal with the first frequency during the normal operation mode, and to receive the data signal and the second clock signal with the second frequency during the minimum-delay debug mode.

2. The apparatus of claim 1, wherein the MDED comprises a dual-edge triggered flip-flop.

3. The apparatus of claim 2, wherein the dual-edge triggered flip-flop comprises a transparent-on-high latch, a transparent-on-low latch, and an output multiplexer, the transparent-on-high latch and the transparent-on-low latch to receive the data signal at respective clock terminals and to receive the second clock signal at respective data terminals.

4. The apparatus of claim 3, wherein the output multiplexer is to receive the data signal, and is to select an output from a non-transparent latch selected from the transparent-on-high latch and the transparent-on-low latch.

5. The apparatus of claim 4, wherein the MDED further comprises an inverter, coupled to the multiplexer, to output an error signal for the MDE in response to a predetermined clock phase sampled by the dual-edge triggered flip-flop.

6. The apparatus of claim 1, wherein the MDED comprises dynamic Domino logic and a static latch coupled to the Domino logic.

7. The apparatus of claim 6, wherein the Domino logic comprises a plurality of first-level stages and a second-level stage coupled to the plurality of first-level stages; wherein the plurality of first-level stages and the second-level stage are pre-charged or pre-discharged during a first phase of the second clock signal; and wherein the second-level stage is to generate an MDE flag when the data signal changes state during a second phase of the second clock signal.

8. The apparatus of claim 6, wherein the static latch is to remain set in response to the detected MDE until a system reset.

9. The apparatus of claim 1, further comprising:

a clock buffer, coupled to the MDED, to adjust the second clock signal to repair the MDE in response to the detected MDE.

10. The apparatus of claim 9, wherein the clock buffer is a post-silicon tunable (PST) clock buffer; and wherein the PST clock buffer is to shorten a delay to the second clock signal when the minimum-delay error is detected.

11. The apparatus of claim 9, wherein the clock buffer is a regional clock buffer (RCB); wherein the RCB is coupled to the MDED and at least another MDED in a clock domain clocked by the RCB; and wherein the RCB is to shorten a delay to the second clock signal based on the minimum-delay error detected by the MDED or another minimum-delay error detected by at least another MDED.

12. The apparatus of claim 1, wherein the second frequency of the second clock signal is lower than or equal to a half of the first frequency.

13. The apparatus of claim 1, wherein the MDED is to detect the MDE in the data path based on a data transition at a predetermined clock phase of the second clock signal.

14. An apparatus comprising:

a clock circuit to receive a first clock signal with a first frequency and to output a second clock signal, wherein the clock circuit is to output the second clock signal with the first frequency in a normal operation mode, and wherein the clock circuit is to output the second clock signal with a second frequency in a minimum-delay debug mode, wherein the second frequency in the minimum-delay debug mode is lower than the first frequency in the normal operation mode; and a minimum-delay error detector (MDED), coupled to the clock circuit, to receive a data signal from a data path, to receive the second clock signal, and to detect a minimum-delay error (MDE) in the data path based on the received data signal and the second clock signal in the minimum-delay debug mode, wherein the MDED comprises a dual-edge triggered flip-flop, and wherein the dual-edge triggered flip-flop comprises a transparent-on-high latch, a transparent-on-low latch, and an output multiplexer, the transparent-on-high latch and the transparent-on-low latch to receive the data signal at respective clock terminals and to receive the second clock signal at respective data terminals.

15. The apparatus of claim 14, wherein the output multiplexer is to receive the data signal, and is to select an output from a non-transparent latch selected from the transparent-on-high latch and the transparent-on-low latch.

16. The apparatus of claim 15, wherein the MDED further comprises an inverter, coupled to the multiplexer, to output an error signal for the MDE in response to a predetermined clock phase sampled by the dual-edge triggered flip-flop.

* * * * *